United States Patent [19]

Naegeli et al.

[11] Patent Number: 4,818,931
[45] Date of Patent: Apr. 4, 1989

[54] VECTOR ANALYZER WITH DISPLAY MARKERS AND LINEAR TRANSFORM CAPABILITY

[75] Inventors: Andrew H. Naegeli, Menlo Park; Juan Grau, San Mateo; Richard A. Nyquist, Menlo Park, all of Calif.

[73] Assignee: Hewlett-Packard Company, Palo Alto, Calif.

[21] Appl. No.: 16,308

[22] Filed: Feb. 19, 1987

[51] Int. Cl.$^4$ ............................................. G01R 23/16
[52] U.S. Cl. .................................. 324/77 B; 364/485
[58] Field of Search ............... 364/570, 484, 485, 486, 364/487; 324/77 B, 78 D, 78 Z, 83 Q, 121 R

[56] References Cited

U.S. PATENT DOCUMENTS

| | | | |
|---|---|---|---|
| 4,257,104 | 3/1981 | Martin et al. | 324/77 B |
| 4,306,186 | 12/1981 | Nakazawa et al. | 324/77 B |
| 4,660,150 | 4/1987 | Anderson et al. | 364/485 |

*Primary Examiner*—Michael J. Tokar
*Assistant Examiner*—Louis M. Arana
*Attorney, Agent, or Firm*—James M. Williams; Bradley A. Perkins; Edward Y. Wong

[57] ABSTRACT

A vector analyzer incorporates a set of five types of markers for the display, which facilitate the visual analysis of the magnitude, phase and time relationships of the I and Q components of the modulation states displayed. The five markers are: an I marker, a Q marker, a magnitude marker, a phase marker and a time marker. The I and Q markers indicate amplitude in the I and Q coordinates displayed on the X-Y displays. The magnitude marker indicates amplitude on the radial coordinate of the X-Y displays. The phase marker indicates relative phase on the angular coordinate of the X-Y displays. The time marker indicates the time coordinate on the displays, and controls the time instant displayed. The analyzer also incorporates a circuit for performing linear transforms on the I, Q, and time data which allows real time adjustment of the sampled signals and enables the signals to be displayed in a three dimensional projection mode. The linear transform can be used to correct the display for three common sources of error in vector modulated signals: amplitude imbalance, phase errors, and quadrature errors. After the display has been corrected, the correction factors are a measure of the errors in the input signal, or in the device demodulating the input signal.

15 Claims, 8 Drawing Sheets

|  | I DISPLAY | Q DISPLAY | VECTOR DISPLAY | CONSTL DISPLAY |
|---|---|---|---|---|
| I MARKER |  |  |  |  |
| Q MARKER |  | HORIZONTAL LINE | HORIZONTAL LINE | HORIZONTAL LINE |
| MAGNITUDE MARKER | NOT SHOWN | NOT SHOWN | CIRCLE | CIRCLE |
| PHASE MARKER | NOT SHOWN | NOT SHOWN | RAY, FROM CENTER TO SCREEN EDGE | RAY, FROM CENTER TO SCREEN EDGE |
| TIME MARKER | VERTICAL LINE AND INTENSIFIED SIGNAL DISPLAY | VERTICAL LINE AND INTENSIFIED SIGNAL DISPLAY | INTENSIFIED SIGNAL DISPLAY | SIGNAL IS DISPLAYED AT TIME MARKER INSTANT, ONLY |

FIG 3

$$\begin{bmatrix} X_{CRT} \\ Y_{CRT} \\ Z \end{bmatrix} = \begin{bmatrix} a_1 & a_2 & a_3 \\ b_1 & b_2 & b_3 \\ c_1 & c_2 & c_3 \end{bmatrix} \begin{bmatrix} I_{(nT)} \\ Q_{(nT)} \\ TIME_{(nT)} \end{bmatrix} \quad (1)$$

$X_{CRT} = a_1 \circ I_{(nT)} + a_2 \circ Q_{(nT)} + a_3 \circ TIME_{(nT)}$ $Y_{CRT} = b_1 \circ I_{(nT)} + b_2 \circ Q_{(nT)} + b_3 \circ TIME_{(nT)}$ $a_1 = \cos\theta_1 \cos\theta_2$ $a_2 = \sin\theta_1 \cos\theta_3 - \cos\theta_1 \sin\theta_2 \sin\theta_3$ $a_3 = \cos\theta_1 \sin\theta_2 \cos\theta_3 + \sin\theta_1 \sin\theta_3$ $b_1 = -\sin\theta_1 \cos\theta_2$ $b_2 = \sin\theta_1 \sin\theta_2 \sin\theta_3 + \cos\theta_1 \cos\theta_3$ $b_3 = \cos\theta_1 \sin\theta_3 - \sin\theta_1 \sin\theta_2 \cos\theta_3$ (2)

FIG 7

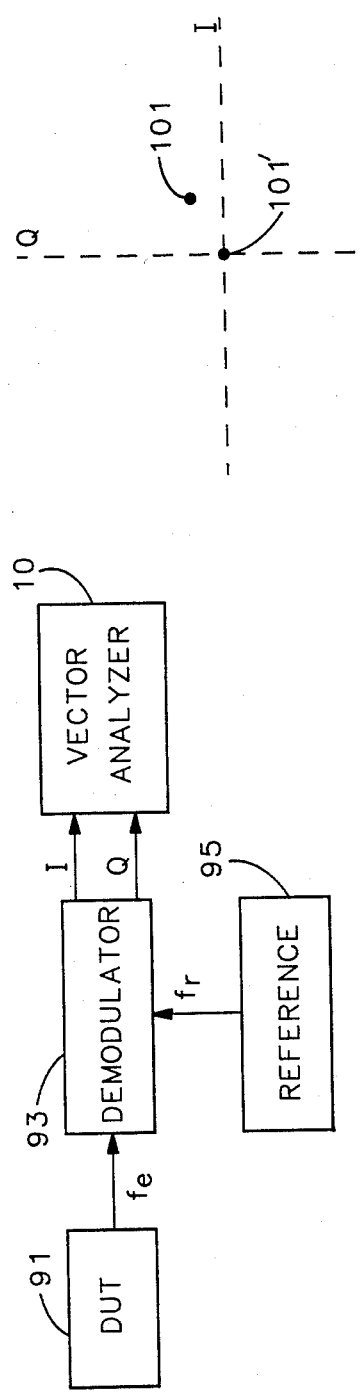
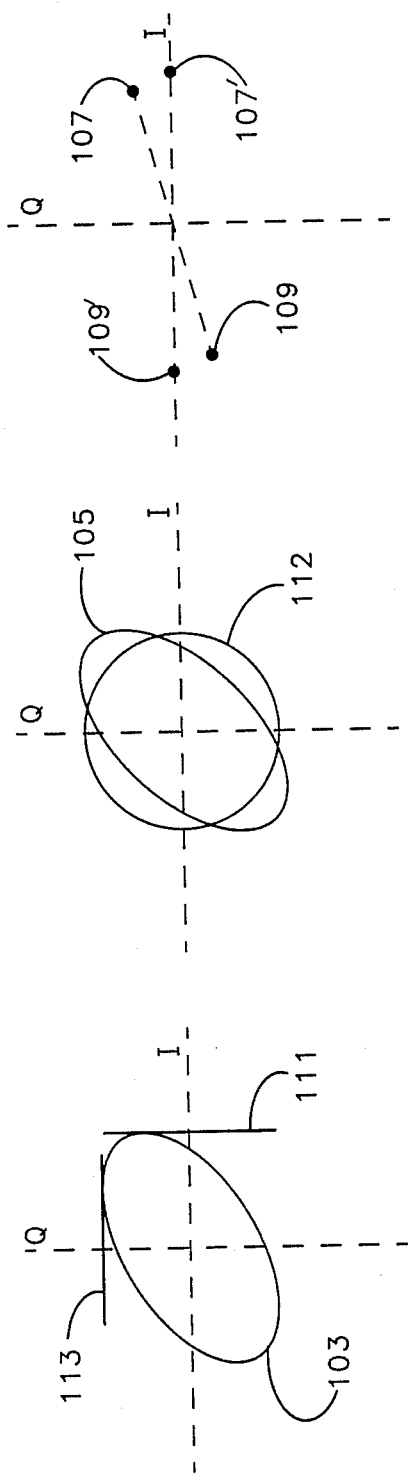

$$\begin{bmatrix} I_{ADJ} \\ Q_{ADJ} \end{bmatrix} = \begin{bmatrix} k_1 & k_2 \\ l_1 & l_2 \end{bmatrix} \begin{bmatrix} I_{IN} \\ Q_{IN} \end{bmatrix} \quad (3)$$

$$I_{ADJ} = k_1 \cdot I_{IN} + k_2 Q_{IN}$$

$$Q_{ADJ} = l_1 \cdot I_{IN} + l_2 Q_{IN}$$

$$k_1 = \cos(p-q/2)/\cos q$$

$$k_2 = \sin(p+q/2)/\cos q$$

$$l_1 = -\sin(p-q/2)/\cos q \quad (4)$$

$$l_2 = \cos(p+q/2)/\cos q$$

FIG 11

VECTOR ANALYZER WITH DISPLAY MARKERS AND LINEAR TRANSFORM CAPABILITY

BACKGROUND AND SUMMARY OF THE INVENTION

The invention relates to video displays for a vector analyzer. One aspect of the invention is a set of markers for the display of a vector analyzer. Another aspect of the invention is a circuit for performing transforms on data which allows real time adjustment of the sampled signals and enables the signals to be displayed in a three dimensional projection mode.

A vector analyzer is a test instrument for use with vector modulated (I/Q modulated) signals. Vector modulation is becoming widespread in radar, microwave and satellite communications and other pulsed component systems. In vector modulation, a carrier signal is modulated by two modulation signals in quadrature: the in phase I, and the quadrature Q modulation signals. A modulated signal can be demodulated with a quadrature detector. The quadrature detector downconverts the modulated signal with two coherent reference signals 90 degrees apart. One downconversion recovers the I component and the other recovers the Q component. For a general discussion of vector modulation and visual displays, see, "Program Helps Teach Digital Microwave Fundamentals", Hewlett-Packard Journal, April 1986, pp. 40-46.

Several vector modulation schemes have evolved, including BPSK, QPSK, 8PSK, AND 16QAM. The resulting modulation patterns can be plotted on a special X-Y display with the I amplitude on the X axis and the Q amplitude on the Y axis.

A vector analyzer measures the amplitude and phase of modulated microwave and RF signals by characterizing the I and Q outputs of quadrature detectors. Because of the complexity of the modulation patterns, visual analysis is important. The vector analyzer has four basic modes of displaying the I and Q signals with respect to each other and with respect to time.

The state or vector diagram mode displays the I component vs. the Q components for a time interval in an X-Y display. The constellation mode displays I vs. Q at a time instant. The EYE diagram mode displays the I or Q component vs. time. The fourth mode is a three dimensional projection of all three variables, I, Q and time onto the X-Y plane.

FIG. 2 shows examples of the four modes for a QPSK modulated signal. FIG. 2a shows the vector mode, FIG. 2b shows the constellation mode, FIGS. 2c and 2d show the I and Q EYE diagram modes respectively, and FIG. 2e shows the three dimensional mode.

One purpose of the vector analyzer is to find any errors in the phase or magnitude of the modulation states displayed. Visual analysis of errors can be very difficult, especially for complex modulation schemes such as 16QAM.

Without display markers for phase and magnitude of the modulation states, the operator would have to calculate the phase and magnitude values and errors from the I and Q values of the states using rectangular-to-polar coordinate conversion formulas.

Other signal analysis instruments have used display markers to aid the visual analysis of the signals. One example is a spectrum analyzer with amplitude and frequency markers, described in U.S. Pat. No. 4,257,104, "Apparatus for Spectrum Analysis of an Electrical Signal", issued Mar. 17, 1981, and in U.S. Pat. No. 4,253,152, "Spectrum Analyzer with Parameter Updating from a Display Marker", issued Feb. 24 1981. However, these markers operated only in the cartesian coordinates of the spectrum analyzer display.

An object of the invention is to provide a set of display markers to aid the analysis of the modulation states displayed by the various display modes of a vector analyzer, operating in both cartesian and polar coordinates.

The vector analyzer of the invention incorporates a set of five types of markers for the display, which facilitate the visual analysis of the magnitude, phase and time relationships of the I and Q components of the modulation states displayed. The five markers are: an I marker, a Q marker, a magnitude marker, a phase marker and a time marker. The I and Q markers indicate amplitude in the I and Q coordinates displayed on the vector and constellation X-Y displays or on the I, Q, and I&Q displays. The magnitude marker indicates amplitude on the radial coordinate of the vector and constellation X-Y displays. The phase marker indicates relative phase on the angular coordinate of the vector and constellation X-Y displays. The time marker indicates the time coordinate on the I, Q, and I&Q displays, and to control the time instant displayed on the constellation display.

In addition to the markers, another aspect of the invention is a circuit for performing linear transforms on the I, Q, and time variable data which allows real time adjustment of the sampled signals and enables the signals to be displayed in a three dimensional projection mode.

This linear transform may be used to correct the display for three common sources of error in vector demodulators: amplitude imbalance, phase errors, and quadrature errors. After the display has been corrected, the correction factors are a measure of the errors in the device demodulating the input signal, or in the input signal itself.

In the three dimensional projection mode the I, Q and time coordinates can be visually compared. At any point in time there is a relationship between these three variables, but the customary oscilloscope displays show only two of the three variables.

BRIEF DESCRIPTION OF THE DRAWINGS

FIG. 3 is a chart that shows the appearance of each of the display markers of the invention in the I, Q, vector and constellation display modes.

FIG. 4a shows a constellation display of a 16QAM modulation signal, with the I marker and Q marker activated. FIG. 4b shows the same constellation display as FIG. 4a, but with the magnitude marker 42 and phase marker 44 activated.

FIG. 7 shows the transform equation (1), and the trigonometric functions (2) that define the matrix coefficients for performing a three dimensional projection of the I, Q, and time variables.

FIG. 9 shows a schematic block diagram of the set up for the analysis of a signal source to be analyzed using the vector analyzer of the invention.

FIG. 10a–d shows the vector analyzer display in the constellation mode for the steps in the calibration of a vector demodulator.

FIG. 11 shows the transform equation (3), and the functions (4) that define the matrix coefficients for converting the input signals $I_{in}$ and $Q_{in}$ to the signals $I_{adj}$ and $Q_{adj}$, which are displayed as Xcrt and Ycrt respectively, to correct quadrature and phase errors of vector demodulators.

DETAILED DESCRIPTION OF THE INVENTION

A vector analyzer is based on a specialized, high speed two-channel sampling oscilloscope. The vector analyzer samples the I and Q inputs of a vector modulated signal and displays them over time or in an analog X-Y display. The I and Q inputs may be digitized with resolution on the order of 12 bits, so the analyzer is useful in accurately measuring the signal's modulation. Phase and amplitude measurements can be displayed, and errors can be measured and analyzed visually.

Visual analysis is aided by a set of markers which the operator can activate and manipulate on the display. There are markers for both cartesian and polar coordinates, eliminating the need to perform conversions of the data from one coordinate system to the other.

Figure 1:
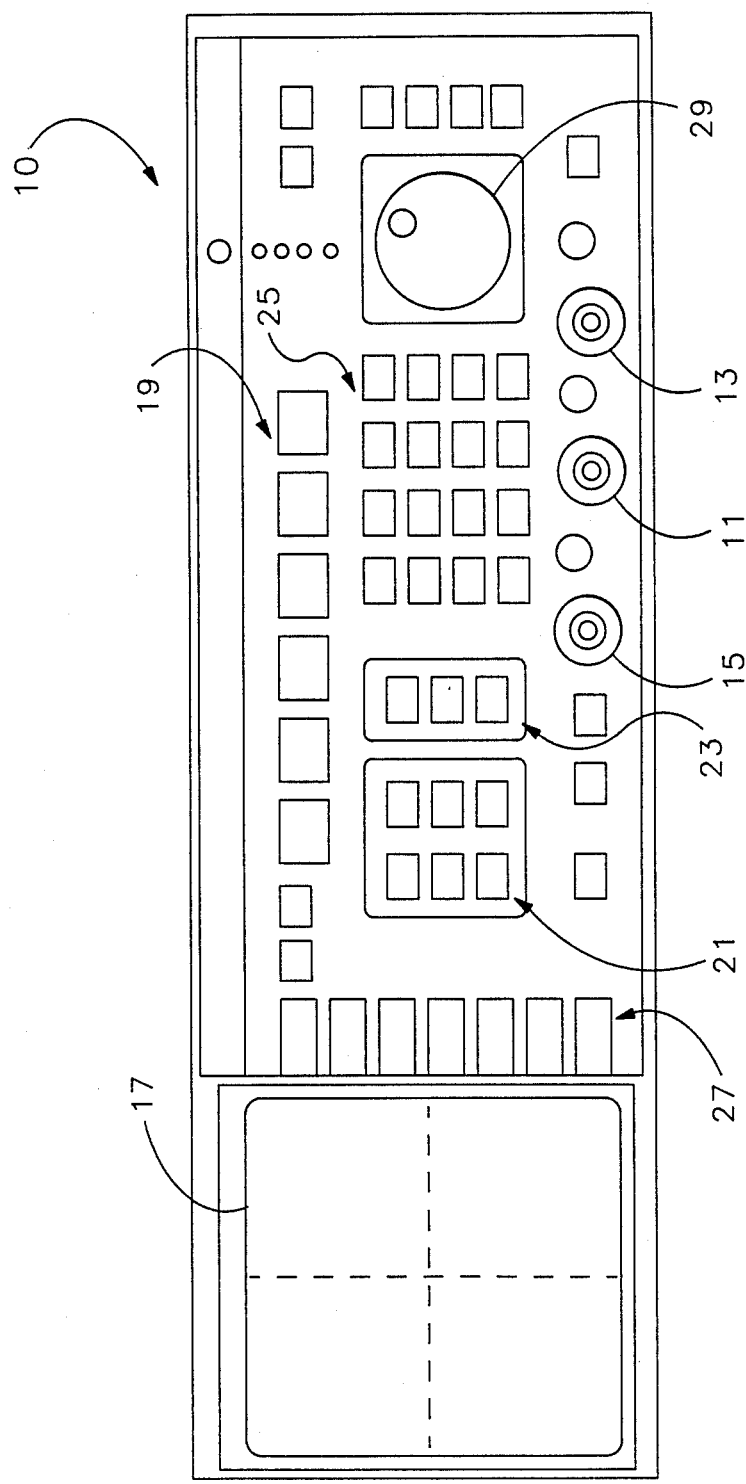
FIG. 1 shows the front panel of a vector analyzer which incorporates the display markers of the invention.

FIG. 1 shows the front panel of a vector analyzer 10 which incorporates the display markers of the invention. The I and Q input signals are applied to the analyzer through coaxial connectors 11 and 13. A third coaxial connector 15 can connect an external trigger signal to the analyzer.

The CRT display screen 17 operates in various display modes selected by a set of display buttons 19. Each of the display buttons activates one of six modes: I, Q, I&Q, vector, constellation and 3-d projection. Another set of three buttons 23 select different processing functions for the I and Q channel signals: timing, gain and offset, and demodulation.

Markers

In addition to the input signals, the operator can choose from a set of five kinds of markers to display on screen 17, to aid in the analysis and measurement of the input signals. The six marker buttons 21 activate the markers on the display screen 17 and also activate menus on the display screen 17 to control the operation of the markers and to control the measurement functions of the analyzer. There are five markers, each activated by one of the marker buttons 21. The sixth marker button activates a menu for controlling the measurement and analysis features of the analyzer 10. Softkeys 27 are used to make selections from the menus on the display to control marker functions.

The position of the markers on screen 17 can be controlled by input from keypad 25 or from rotary knob 29, in conjunction with the softkeys 27. Keypad 25 includes numeric keys for entering a selected value and up/-down, right/left arrow keys for stepwise movement. Rotary knob 29 can be used for continuously adjustable movement of the markers.

The five markers are: the I marker, the Q marker, the magnitude marker, the phase marker and the time marker. FIG. 3 is a chart that describes the appearance of each of these markers in each of the display modes.

The I marker appears as a line perpendicular to the I coordinate axis at a selected I value. In the I vs. time display, it is a horizontal line. In the vector and constellation I vs. Q displays, it is a vertical line.

Pressing the I marker button places the I marker on the display, and activates a menu display for control of the I marker. Included in the menu are: I marker value, I marker on/off, delta I on/off, and I marker to center softkey functions. The I marker value softkey function activates the keypad 25 and rotary knob 29 to set the I marker value, allowing the I marker to be moved around the display screen.

The I marker on/off softkey function toggles the display of the I marker off or on.

The delta I on/off softkey function allows the operator to create and anchor a delta I marker at a selected position on the display screen, move the I marker to another position, and measure the difference between the two values.

The I marker to center softkey function sets the I marker to the center of the display.

The Q marker appears as a line perpendicular to the I coordinate axis at a selected Q value. In the Q vs. time display, it is a horizontal line. In the vector and constellation I vs. Q displays, it is also a horizontal line.

Pressing the Q marker button places the Q marker on the display, and activates a menu display for control of the Q marker, that is similar to the menu for the I marker discussed above. Included in the menu are: Q marker value, Q marker on/off, delta Q on/off, and Q marker = center softkey functions.

The magnitude marker is a polar coordinate marker that appears as a circle on the vector and constellation displays, at a selected vector magnitude.

Pressing the magnitude marker button places the magnitude marker on the display, and activates a menu display for control of the magnitude marker, that is similar to the menus for the I and Q markers discussed above. Included in the menu are: magnitude marker value, magnitude marker on/off, and delta magnitude on/off. The magnitude marker menu has no "center" function.

The phase marker is a polar coordinate marker that appears as a ray from the origin to the screen edge on the vector and constellation displays, at a selected phase angle.

Pressing the phase marker button places the phase marker on the display, and activates a menu display for control of the phase marker, that is similar to the menus for the magnitude marker discussed above. Included in the menu are: phase marker value, phase marker on/off, and delta phase on/off.

The time marker appears as a line perpendicular to the time axis or as an intensified signal display. In the Q vs. time and I vs. time displays, it is a vertical line and an intensified signal display. In the vector I vs. Q display, it is an intensified signal display. In a constellation display, the time marker controls the time instant displayed.

Pressing the time marker button places the time marker on the display, and activates a menu display for control of the time marker, that is similar to the menu for the I and Q markers discussed above. Included in the menu are: time marker value, time marker on/off, delta time on/off, and time marker = center softkey functions.

The operation and use of the markers can be more easily understood in the context of an example of a measurement. FIG. 4 shows an example of a screen display of a constellation display of a 16QAM modulation signal, with the I marker and Q marker activated. The sixteen vector modulation states appear as dots or clusters of points on the display. The operator has set the I marker 41 to the I value for one column of four states. From the display, the operator can determine that these four states have the same I modulation value and are in alignment. The operator has set the Q marker 43 to the value for the top row of states. From the display, the operator can determine that there is a modulation error for state 45, in the upper right corner of the display. Using the delta Q function, the operator can quantify the modulation error of state 45.

Figure 4B:
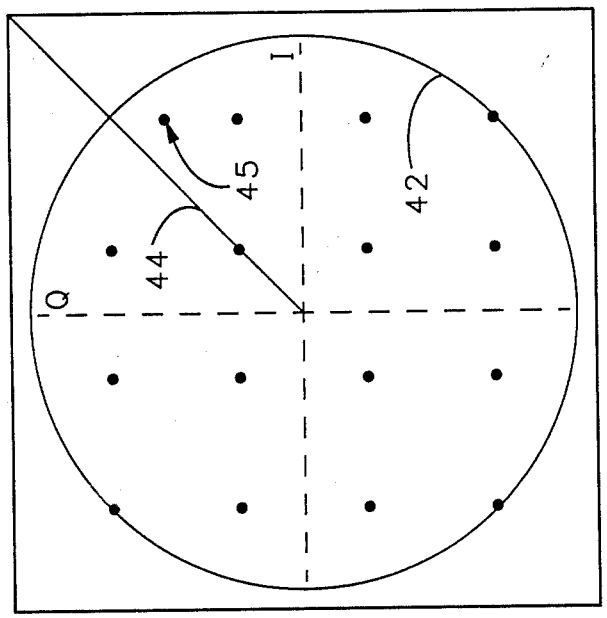
FIG. 4a-b shows screen displays which illustrate the operation of the I, Q, magnitude and phase markers of the invention.
Figure 4A:
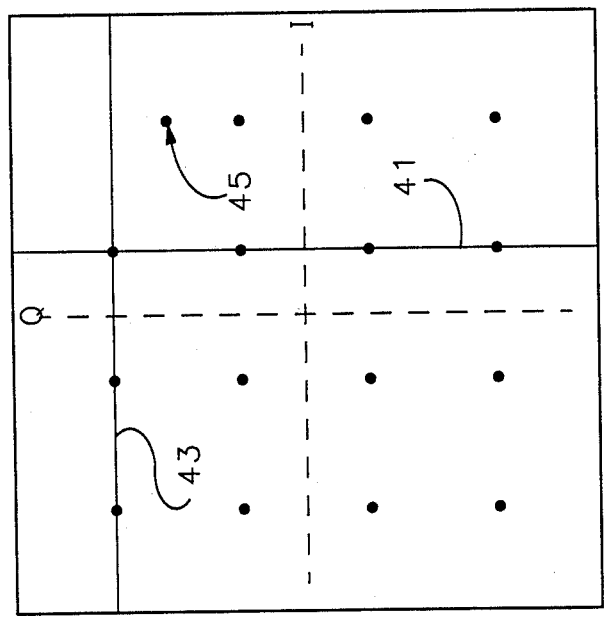

FIG. 4b shows the same constellation display as FIG. 4a, but this time with the magnitude marker 42 and phase marker 44 activated. The operator has set the magnitude marker 42 at the magnitude for the far corner states, and the phase marker 44 at the 45 degree phase for the upper right quadrant diagonal states. From the display, the operator can determine that state 45 has errors in both its magnitude and phase. With the delta phase and delta magnitude markers, these errors can be measured.

Without the phase and magnitude markers, the operator would have to calculate the phase and magnitude values and errors from the I and Q values of the states using rectangular-to-polar coordinate conversion formulas.

The operation of the time marker is illustrated in FIG. 5. The I vs. time display for a QPSK modulated signal, with the time and I markers activated, is shown in FIG. 5a. The modulation signal is displayed by traces 52a and 52b along the time axis. The operator has set the time marker 57 at a point at which the signal state is stable. As FIG. 5a shows, the display traces are intensified at the points 54a and 54b where the signal traces 52a and 52b cross the time marker 57. The I marker 41 is displayed, but has not been set to a significant value for the signal displayed.

Figure 5B:
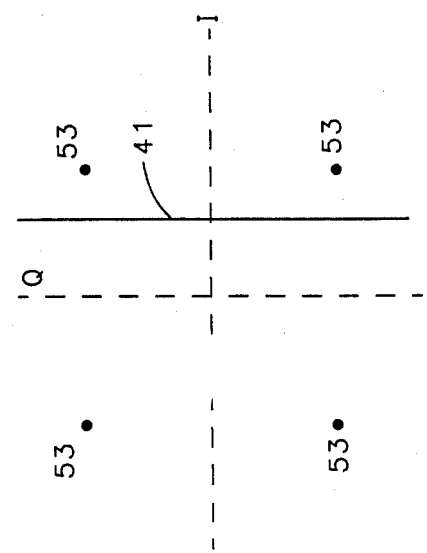
FIG. 5a-d shows a series of displays illustrating the operation of the time marker.
Figure 5D:
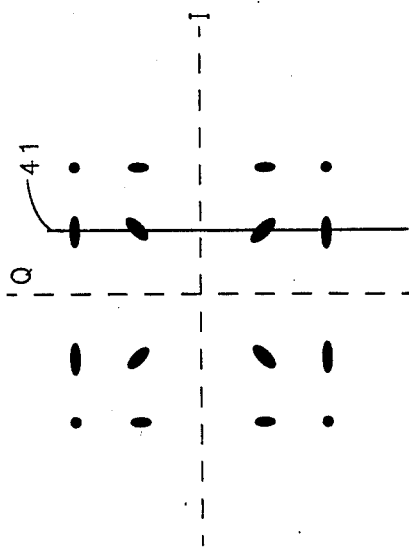
Figure 5A:
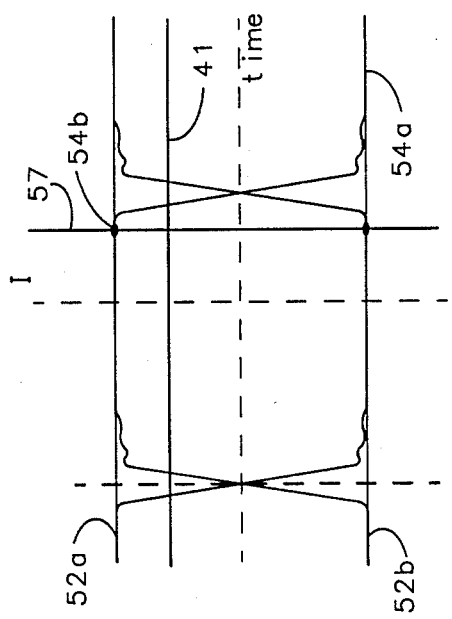
Figure 5C:
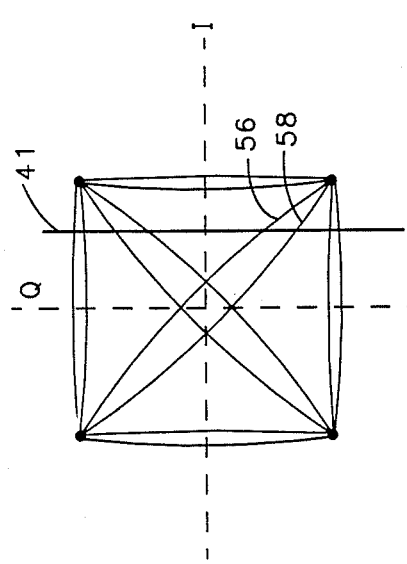

FIG. 5b and 5c show the constellation and vector displays that correspond to the time selected in FIG. 5a. In the constellation display, FIG. 5b, the instantaneous values of the signal at the time selected are displayed. Thus the modulation states appear as points 53. The vector display, FIG. 5c, shows the signal values over the time interval of the I vs. time display. Thus, in the vector display the modulation states, where the signal is stable for some time, appear as intensified points or clusters, connected by dim traces of the transition paths 56, 58 followed when the signal is changing states.

FIG. 5d illustrates the effect of moving the time marker. If the time marker is moved to an instant when the signals are changing states, such as 57' in FIG. 5a, the transition can be displayed and analyzed in more detail. FIG. 5d shows the constellation display when the time marker is moved to 57'. In comparison with the display in FIG. 5b, FIG. 5d shows the transition states in addition to the stable modulation states. Also, in FIG. 5d, the I marker 41 has been positioned at one of the transition values to measure and analyze the transition.

Signal Transforms

In addition to the markers, another aspect of the invention is a circuit for performing linear transforms on the I, Q, and time variable data which allows real time adjustment of the sampled signals and enables the signals to be displayed in a three dimensional projection mode.

This linear transform may be used to correct the display for three common sources of error in vector modulated signals: amplitude imbalance, phase errors, and quadrature errors. After the display has been corrected, the correction factors are a measure of the errors in the device demodulating the input signal, or in the input signal itself.

In the three dimensional projection mode the I, Q and time coordinates can be visually compared. At any point in time there is a relationship between these three variables, but the customary oscilloscope displays show only two of the three variables.

Figure 2C:
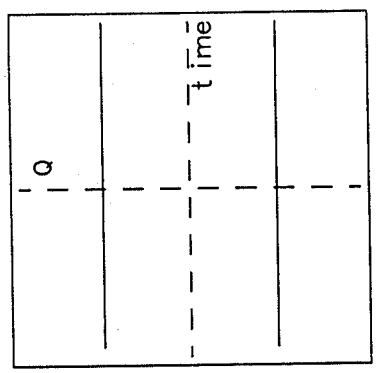
FIG. 2a-e shows examples of the five display modes of a vector analyzer for a QPSK modulated signal.
Figure 2B:
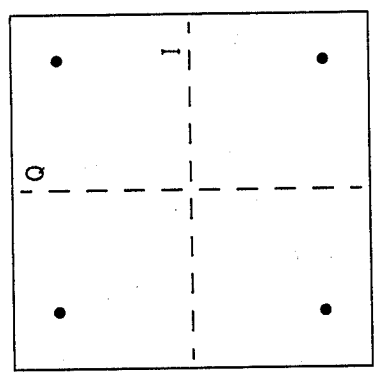
Figure 2A:
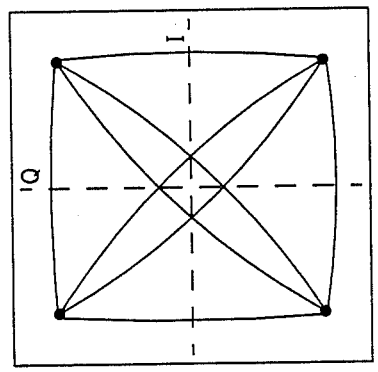
Figure 2E:
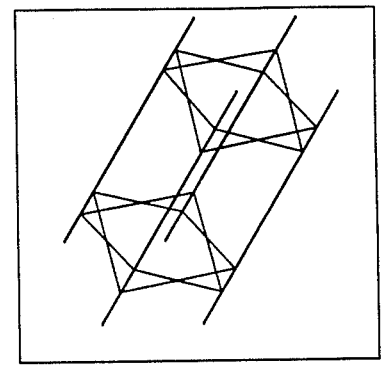
Figure 2D:
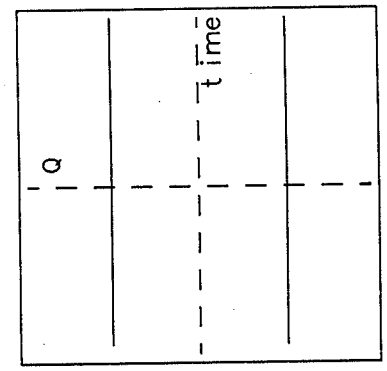

The three dimensional projection display mode of the invention, as shown in FIG. 2e, is a view of the three dimensional space spanned by the I, Q, and time variables on the display screen 17 of the analyzer. This provides the operator a more intuitive understanding of the interrelationship of the I, Q and time variables, and helps the visual analysis of the signal. The projection circuits of the invention create a real time display of the sampled input signal data which is changing at up to a 1 MHz rate, using a relatively slow microprocessor and inexpensive analog components. The transform calculations are separated into analog and digital processing tasks. The analyzer's microprocessor performs the trigonometric calculations to generate the transform coefficients associated with the rotation based on the rotation angles entered by the user. These coefficients change at user speed, around two to three times a second. Analog circuits then use the transform coefficients to perform the multiplications and additions that transform the I, Q and time values of the 1 MHz signal into the X-Y display signal. This makes it possible to generate a real time 1 MHz display with the rapidly changing input signal updated by the fast analog components, and the relatively slowly changing rotation coefficients updated by the microprocessor.

Figure 6:
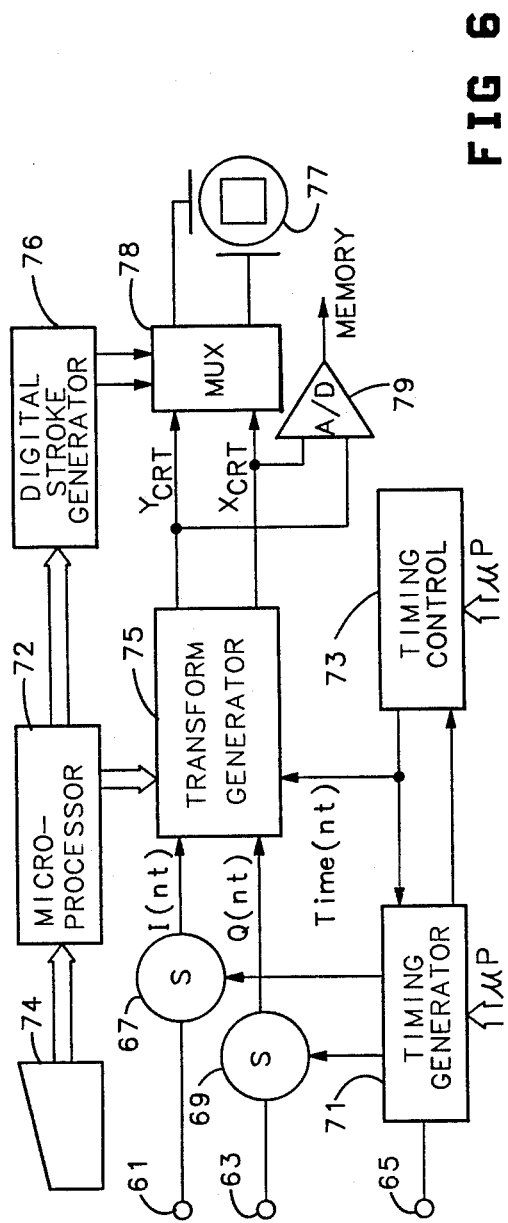
FIG. 6 shows a schematic block diagram of the vector analyzer of the invention including the transform generator circuit.

FIG. 6 shows a schematic block diagram of the preferred embodiment of the vector analyzer of the invention, including the transform generator circuit. The I and Q input signals are applied at input lines 61 and 63 respectively. The input circuits have about 350 MHz bandwidth in order to handle radar and digital communication signals. The input signals are sampled by samplers 67 and 69, which are driven by sampling pulses from timing generator 71. Timing generator 71 is controlled by the trigger signals received on input line 65, and a TIME signal received from timing control 73. The trigger signal synchronizes the sampling pulses with the phase of the I and Q input signals. The TIME signal varies the time delay of the sampling pulses with respect to the input signal to produce samples over the period of the signal.

The I(nt), Q(nt) and TIME(nt) signals, which comprise a coordinate triplet for the input signal, are sent to the transform processor 75. The task of the transform processor 75 is to transform the I, Q and TIME coordinate triplet into the signals Xcrt and Ycrt for the X-Y display 77. Microprocessor 72 receives the operator's instructions through keypad 74, and controls the operation of transform processor 75 based on the display mode and other parameters selected. Microprocessor 72 also controls the operation of digital stroke processor 76 to display the markers and alphanumeric characters on display 77. The output from the digital stroke processor 76 is multiplexed with the output from the transform processor 75 by multiplexer 78 to produce the display signal applied to the X-Y display 77. For further description of the generation of markers on a display and positioning of the markers by operator keyboard input, refer to U.S. Pat. No. 4,253,152, "Spectrum Analyzer with Parameter Updating from a Display Marker", issued Feb. 24, 1981.

It takes the timing processor 71 and the timing control 73 about 1 microsecond from the time the last sample was taken to generate the sample pulse for the next sample. This limitation imposes a 1 MHz limit on the sampling rate. Because I(t), Q(t) and TIME (t) will be changing at about 1 MHz, they can be processed with bandwidths of 5 to 10 MHz, rather than the 350 MHz bandwidth required to process the I and Q input signals.

For digital analysis of the data from the vector analyzer, the Xcrt and Ycrt signals are fed to analog-to-digital converter 79, which converts the analog signals into a stream of digital data for storage in a memory.

In the three dimensional display mode, transform processor 75 produces Xcrt and Ycrt signals for a three dimensional projection view based on the coordinate triplet of the input signal. The transform processor calculates the coefficients of a 3×3 transform matrix and multiplies the I,Q and TIME inputs by this matrix to produce the Xcrt and Ycrt outputs applied to the display 77. FIG. 7 shows the transform equation (1), and the trigonometric functions (2) that define the matrix coefficients $a_1$, $a_2$, $a_3$, $b_1$, $b_2$, and $b_3$. The matrix coefficients are trigonometric functions of the rotation angles $O_1$, $O_2$, and $O_3$. Since the Z axis information is not displayed, $c_1$, $c_2$ and $c_3$ are not defined.

Figure 8:
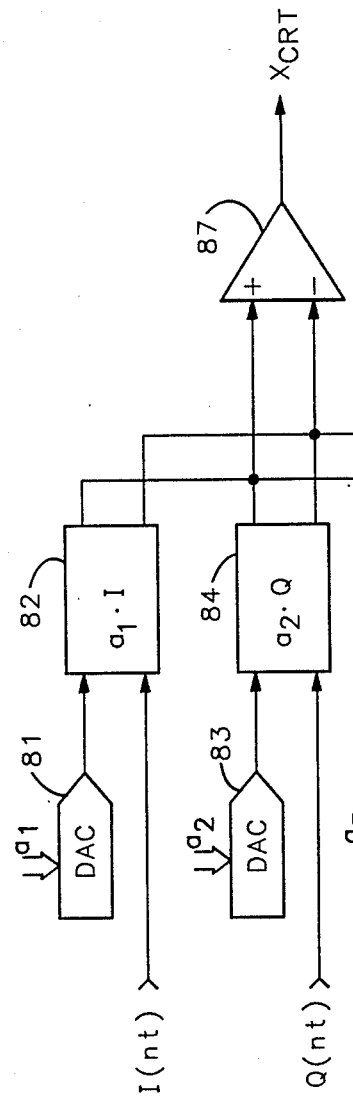
FIG. 8 shows a schematic diagram of the circuit for the Xcrt half of the projection generator in FIG. 6.

A schematic diagram of the circuit implementation for the Xcrt half of the transform processor 75 is shown in FIG. 8. The circuit of FIG. 8 performs the multiplication for the Xcrt signal. Digital to analog converters (DAC) 81, 83 and 85 receive the matrix coefficients $a_1$, $a_2$ and $a_3$, respectively, from the microprocessor, and convert the digital values to analog signals. Analog multiplier receives the $a_1$ and I(nt) signals and multiplies them to generate the product $a_1$ I(nt). Similarly, analog multiplier 84 generates the product $a_2$ Q(nt), and analog multiplier 86 generates the product $a_3$ TIME (nt). Amplifier 87 sums the three products to produce Xcrt. The other half of the transform processor 75 is a similar circuit that produces the Ycrt signal.

Alternatively, the transform processor can be implemented with a digital processing system. In such a system, A/D converters would convert the sampled I and Q input signals form samplers 67 and 69 into digital form before the signals are input to the transform processor.

The transform processor circuits can also be used to perform other types of linear transformations of the I, Q and TIME variables. The microprocessor can be programmed to calculate the matrix coefficients for the transform and the analog transform processor performs the matrix multiplication.

The gain and offset and demodulation buttons, in the I and Q channel function set 23 (see FIG. 1) activate menu displays to make the adjustments to the analyzer's display by applying transforms to the input signals. This method may be used to correct the display for three common sources of error in vector modulated signals: amplitude imbalance, phase errors, and quadrature errors. After the display has been corrected, the correction factors are a measure of the errors in the input signal, or in the device generating the input signal.

One example of the use of this feature is the calibration of a vector demodulator for analysis of a BPSK vector modulated signal source. FIG. 9 shows a schematic block diagram of the set up for the analysis of a signal source to be analyzed, device under test (DUT) 91. The modulated signal from DUT 91, at a carrier frequency $f_c$, is demodulated by demodulator 93, and the resulting I and Q signals are applied to vector analyzer 10. To remove any errors contributed by the demodulator, the demodulator must be calibrated prior to making the analysis of DUT 91. For calibration, a reference source 95 can supply signals, at frequency $f_r$, to demodulator 93 in addition to the signals from the DUT 91.

The steps in the calibration are illustrated in FIG. 10, which shows the vector analyzer display in the constellation mode for each of the steps.

The first step is to calibrate the demodulator for offset and amplitude imbalance. This is done with the gain and offset menu functions. Included in the menu are: volts/division I & Q, volts/division I, volts/division Q, offset I channel, and offset Q channel. In each of these functions, the entry keys 25 and knob 29 set the offset values and the gain of the analyzer display.

The DUT 91 is disconnected from the demodulator. This unmodulated signal appears as a dot 101 on the display, which may be offset from the origin. The I channel and Q channel offset functions are adjusted until the dot appears at the origin of the display 101', correcting any offsets, FIG. 10a.

The DUT 91 and the reference source 95 are then connected to the demodulator, with $f_r=f_c+e$, where e is a small frequency difference. This combination of signals appear as a circle or an ellipse on the display because of the constantly changing phase difference between the two signals, FIG. 10b. The display will appear as a circle only if there are no amplitude imbalance or quadrature errors. In general, the display will be an ellipse.

An amplitude imbalance error moves the major and minor axes of the ellipse off of the 45 degree axes of the display and causes the ellipse 103 to project farther along either the I or Q axis. The projection values can be measured and compared conveniently with the I marker 111 and the Q marker 113. The projections are adjusted using either the I volts/division or the Q volts/division function.

The corrections for quadrature and phase errors are made with functions activated by the DEMOD button. The functions include: quadrature adjust and phase adjust. In these functions, the entry keys 25 and knob 29 change the quadrature and phase of the I and Q signals displayed.

A quadrature error changes the length of the major and minor axes and causes the display to appear as an ellipse rather than as a circle, FIG. 10c. Quadrature error can be corrected using the quadrature adjust function which changes the phase angle between the I and Q signals. The ellipse display 105 can be adjusted to a circle by comparing it to the magnitude marker 112, which will appear as a perfect circle on the display.

The final step is to correct for phase errors. To correct the phase error, the reference frequency $f_r$ is set equal to the DUT frequency $f_c$. This causes the display to return to the conventional BPSK display of two dots on opposite sides of the origin, FIG. 10d. A phase error causes the dots 107, 109 to be off the I axis. The display can be adjusted using the phase adjust function, which changes the phase angle of the signal with respect to the display, moving the dots to positions 107', 109' on the I axis.

The offset adjust and gain adjust functions are implemented in the conventional way used in digitizing oscilloscope displays. The quadrature adjust and phase adjust functions are implemented with the transform processor 75, and matrix coefficients defined to produce the necessary transform.

FIG. 11 shows the transform equation (3), and the functions (4) that define the matrix coefficients for converting the input signals $I_{in}$ and $Q_{in}$ to the signals $I_{adj}$ and $Q_{adj}$, which are displayed as Xcrt and Ycrt respectively. The matrix coefficients are functions of the quadrature adjustment value, q, and the phase adjustment value, p, entered by the operator using the quadrature and phase adjustment functions. Since the time variable is not involved, the matrix is a 2×2 matrix.

The microprocessor calculates the matrix coefficients based on the values entered by the operator, and the analog multipliers for the I and Q signals perform the multiplications.

We claim:

1. Apparatus for use in the display and analysis of vector modulated signals, comprising:
    input means for receiving an input signal including inphase and quadrature components;
    sampling means for sampling the input signal to provide a sampled signal;
    signal processing means coupled to the sampling means for generating an electronic representation of the input signal in response to the sampled signal;
    display control means coupled to the signal processing means and responsive to operator control signals for providing display control signals;
    display means coupled to the signal processing means and to the display control means, for providing a waveform display in response to the electronic representation of the sampled signals and to the display control signals;
    operator controls coupled to the display control means and including means for providing operator control signals in response to operator manifestations for selecting and positioning a marker on the waveform display;
    said operator control signals including marker control signals for causing the display means to display visual representations of vector magnitude markers, vector phase markers, and time markers at selected values of cartesian or polar coordinates on the waveform display.

2. The apparatus of claim 1 wherein the electronic representation of the input signal includes inphase amplitude, quadrature amplitude and time data for the signal samples.

3. The apparatus of claim 2 wherein the operator control signals include display mode signals for causing the waveform display to show inphase amplitude vs. quadrature amplitude, inphase amplitude vs. time, or quadrature amplitude vs. time.

4. The apparatus of claim 3 wherein the marker control signals for the time marker control the time instant of the inphase amplitude and quadrature amplitude data appearing on the waveform display.

5. The apparatus of claim 3 wherein the operator control signals further include display mode signals for causing the signals further include display mode signals for causing the waveform display to show a projection of inphase amplitude vs. quadrature amplitude vs. time.

6. The apparatus of claim 2 wherein the signal processing means comprises transform processor means for applying a linear transform to the inphase amplitude, quadrature amplitude and time data of the signal samples to produce the electronic representation of the sampled signal.

7. The apparatus of claim 6 wherein the display control means calculates transform coefficients for the linear transform based on the operator control signals, and the transform processor means comprises a high speed analog circuit for multiplying the sampled signal data by the transform coefficients and summing the results.

8. The apparatus of claim 7 wherein the transform processor means is capable of making real time adjustments of the sampled signals and correcting the waveform display for amplitude imbalance errors, phase errors, and quadrature errors in the input signal.

9. The apparatus of claim 7 wherein the transform processor means is capable of generating control signals for the x and y axes of the display means based on the inphase amplitude, quadrature amplitude and time data of the signal samples.

10. The apparatus of claim 9 wherein the transform processor means is capable of generating control signals for causing the waveform display to show inphase amplitude vs. quadrature amplitude, inphase amplitude vs. time, or quadrature amplitude vs. time in response to the display mode signals.

11. The apparatus of claim 10 wherein the transform processor means is capable of generating control signals for causing the waveform display to show inphase amplitude vs. quadrature amplitude, inphase amplitude vs. time, or quadrature amplitude vs. time corrected for amplitude imbalance errors, phase errors, and quadrature errors in the input signal.

12. Apparatus for use in the display and analysis of vector modulated signals, comprising:
    input means for receiving an input signal including inphase and quadrature components;
    signal processing means coupled to the input means for generating an electronic representation of the input signal;
    display control means coupled to the signal processing means and responsive to operator control signals for providing display control signals;
    display means coupled to the signal processing means and to the display control means, for providing a waveform display in response to the electronic representation of the input signal and to the display control signals;
    operator controls coupled to the display control means and including means for providing operator control signals in response to operator manifestations for selecting a waveform display and making real time adjustments of the electronic representation of the input signal to correct the waveform display for amplitude imbalance errors, phase errors, and quadrature errors in the input signal.

13. The apparatus of claim 12 further comprising sampling means connected between the input means and the signal processing means for sampling the input signal to provide a sampled signal, and wherein the signal processing means generates the electronic representation of the input signal in response to the sampled signal.

14. Apparatus for use in the display and analysis of vector modulated signals, comprising:

input means for receiving an input signal including inphase and quadrature components;

signal processing means coupled to the input means for generating an electronic representation of the input signal;

storage means coupled to the signal processing means for storing the electronic representation of the input signal;

operator controls coupled to the signal processing means and including means for providing operator control signals in response to operator manifestations for making real time adjustments to correct the electronic representations of the input signal for amplitude imbalance errors, phase errors, and quadrature errors in the input signal.

15. The apparatus of claim 14 further comprising sampling means connected between the input means and the signal processing means for sampling the input signal to provide a sampled signal, and wherein the signal processing means generates the electronic representation of the input signal in response to the sampled signal.

* * * * *